(12) United States Patent
Mulder et al.

(10) Patent No.: US 10,145,911 B2
(45) Date of Patent: Dec. 4, 2018

(54) AIR VENTILATION SYSTEM WITH RADIO FREQUENCY SHIELDING FOR USE IN MAGNETIC RESONANCE IMAGING SYSTEMS

(71) Applicant: KONINKLIJKE PHILIPS N.V., Eindhoven (NL)

(72) Inventors: Gerardus Gernardus Jozef Mulder, Eindhoven (NL); Cornelis Leonardus Gerrardus Ham, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 166 days.

(21) Appl. No.: 15/317,984

(22) PCT Filed: Jun. 2, 2015

(86) PCT No.: PCT/EP2015/062282
§ 371 (c)(1),
(2) Date: Dec. 12, 2016

(87) PCT Pub. No.: WO2015/197321
PCT Pub. Date: Dec. 30, 2015

(65) Prior Publication Data
US 2017/0108563 A1    Apr. 20, 2017

(30) Foreign Application Priority Data

Jun. 23, 2014  (EP) ..................... 14173472

(51) Int. Cl.
*G01R 33/34* (2006.01)
*G01R 33/28* (2006.01)
*G01R 33/38* (2006.01)

(52) U.S. Cl.
CPC ......... *G01R 33/3403* (2013.01); *G01R 33/28* (2013.01); *G01R 33/3804* (2013.01)

(58) Field of Classification Search
CPC .. G01R 33/3403; G01R 33/28; G01R 33/288; G01R 33/31; G01R 333/815; G01R 33/3856; G01R 33/56563; A61B 6/045
See application file for complete search history.

(56) References Cited

U.S. PATENT DOCUMENTS

2005/0030028 A1   2/2005  Clarke et al.
2005/0192473 A1*  9/2005  Lonneker-Lammers .................... A61G 11/00
                                                                    600/22

(Continued)

FOREIGN PATENT DOCUMENTS

DE    202013105276 U1   12/2013
JP    10225446 A         8/1998

(Continued)

*Primary Examiner* — Clayton E Laballe
*Assistant Examiner* — Ruifeng Pu

(57) ABSTRACT

An air ventilation device for use in a magnetic resonance imaging system, the air ventilation device comprising: —an electric motor-driven fan (30), —a fan housing (34) having at least one air intake opening (36) and at least one air outlet opening (38), wherein the fan (30) is arranged inside the fan housing (34) between the at least one air intake opening (36) and the at least one air outlet opening (38), —at least one ventilation duct (40) connected to the at least one air outlet opening (38), wherein the fan housing (34) is designed as an open-ended waveguide (24) for conveying electromagnetic waves having a cutoff frequency ($f_c$) that is larger than a largest frequency of the emission spectrum that exceeds a predefined amplitude-related parameter, and wherein one end of the waveguide (24) serves as the at least one air intake opening (36), and the opposite end of the waveguide (24) serves as the at least one air outlet opening (38); and a magnetic resonance imaging system comprising a scanner unit (10) that is configured for acquiring magnetic resonance (Continued)

images from a subject of some interest, and an embodiment of such air ventilation device.

9 Claims, 1 Drawing Sheet

(56) References Cited

U.S. PATENT DOCUMENTS

| | | | | |
|---|---|---|---|---|
| 2009/0134874 A1* | 5/2009 | Katsunuma | ........ | G01R 33/3403 |
| | | | | 324/318 |
| 2009/0134875 A1 | 5/2009 | Tomiha et al. | | |
| 2009/0160443 A1* | 6/2009 | Albrecht | ................ | G01R 33/28 |
| | | | | 324/318 |
| 2010/0134109 A1* | 6/2010 | Takamori | ......... | G01R 33/34007 |
| | | | | 324/318 |
| 2015/0301134 A1* | 10/2015 | Hoshino | ................ | G01R 33/31 |
| | | | | 324/307 |
| 2015/0323193 A1* | 11/2015 | Gillespie | ................... | F24C 7/08 |
| | | | | 126/21 A |
| 2016/0038101 A1* | 2/2016 | Benner | ................ | A47C 21/044 |
| | | | | 5/421 |

FOREIGN PATENT DOCUMENTS

| | | |
|---|---|---|
| JP | 2008125928 A | 6/2008 |
| JP | 2011143160 A | 7/2011 |
| JP | 2011161093 A | 8/2011 |

* cited by examiner

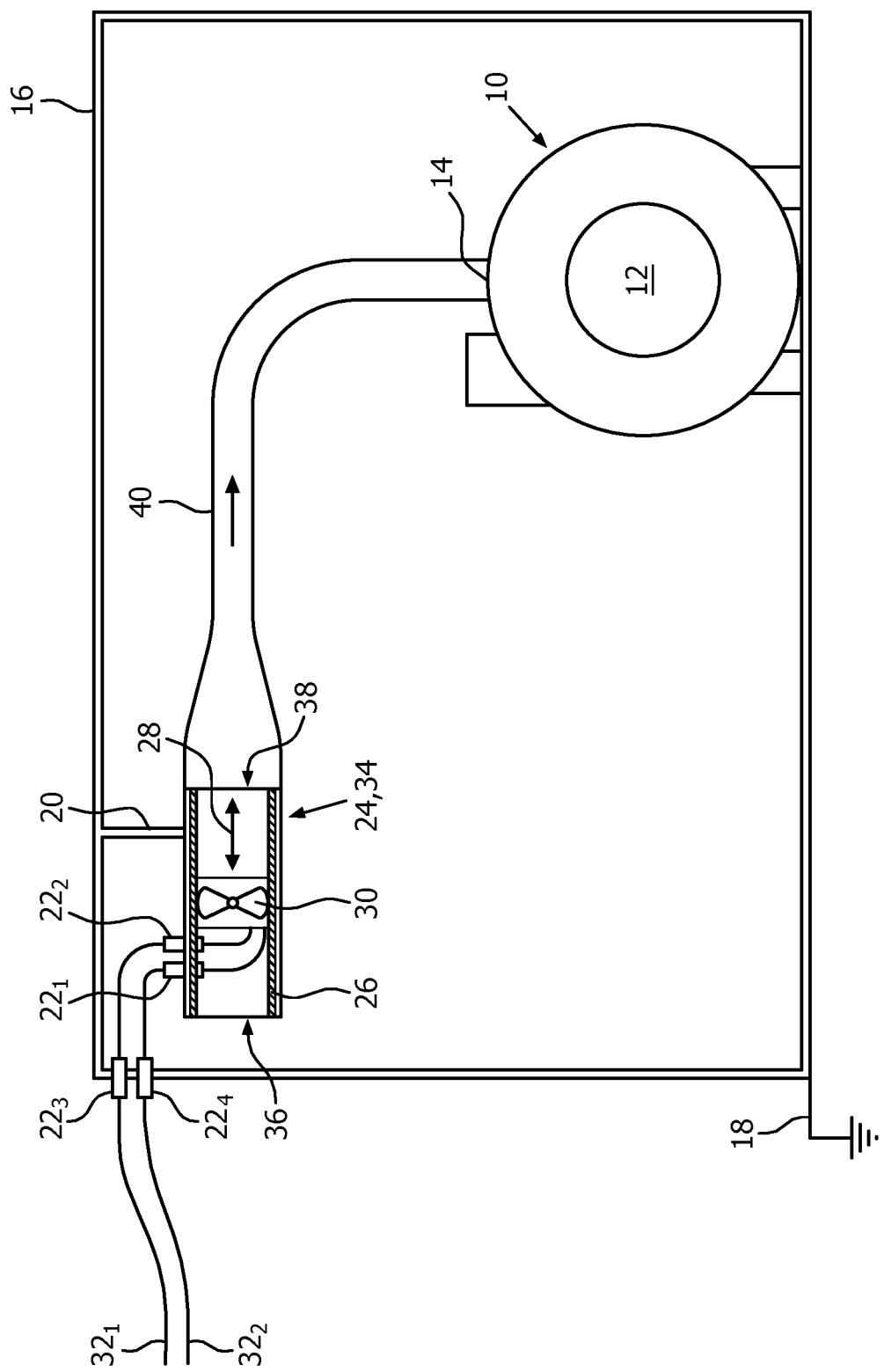

AIR VENTILATION SYSTEM WITH RADIO FREQUENCY SHIELDING FOR USE IN MAGNETIC RESONANCE IMAGING SYSTEMS

CROSS REFERENCE TO RELATED APPLICATIONS

This application is a U.S. national phase application of International Application No. PCT/EP2015/062282, filed on Jun. 2, 2015, which claims the benefit of EP Application No. 14173472.3 filed on Jun. 23, 2014 and is incorporated herein by reference.

FIELD OF THE INVENTION

The invention pertains to an air ventilation device for use in a magnetic resonance imaging system, and a magnetic resonance imaging system comprising a suchlike air ventilation device.

BACKGROUND OF THE INVENTION

In the field of magnetic resonance imaging, it is known to employ an air ventilation system having a fan for cooling the patient or other parts of a scanner unit of a magnetic resonance imaging system. A cooling system for circulating a coolant such as air to cool a cylindrical patient bore of a magnetic resonance imaging system is described, for example, in US patent application 2005/0030028 A1. The US patent application US 2009/0134875 discloses a cooling unit for a magnetic resonance imaging system with a duct and a fan to circulate cooling air of the circuit elements of an RF coil. The fan is provided outside the shield room to avoid the electric system of the fan to influence signals received by the RF coil.

From efficiency considerations it is preferable to place the fan inside a radio frequency shielded room that the scanner unit is customarily installed in. In such a constellation, measures have to be taken to avoid electromagnetic interference (EMI) between the fan in operation and the EMI-susceptible electronics of the scanner unit, for instance by installing a radio frequency shield around the fan.

SUMMARY OF THE INVENTION

It is desirable to reduce the effort for meeting requirements regarding a maximum tolerable electromagnetic interference caused by air ventilation devices in magnetic resonance imaging systems in which an air fan of the air ventilation device is placed inside a radio frequency shielded room, together with a scanner unit of the magnetic resonance imaging system.

It is therefore an object of the invention to provide an effectively working and simplified air ventilation device that is as well able to effectively reduce or avoid electromagnetic interference from electromagnetic signals generated by the air ventilation device in operation.

In one aspect of the present invention, the object is achieved by an air ventilation device for use in a magnetic resonance imaging system, the air ventilation device comprising:

an electric motor-driven fan, wherein the fan generates signals of electromagnetic interference during operation that form an emission spectrum, a fan housing having at least one air intake opening and at least one air outlet opening, wherein the fan is arranged inside the housing between the at least one air intake opening and the at least one air outlet opening, and is configured to, in at least one state of operation, take in air through the at least one air intake opening and to convey the air towards the at least one air outlet opening, and at least one ventilation duct provided as a fluid connection that is, in at least one state of operation, connected to the at least one air outlet opening and is connectable to at least one air ventilation inlet port of a scanner unit of the magnetic resonance imaging system.

The fan housing is designed as an open-ended waveguide for electromagnetic waves, particularly radio frequency waves, having a cutoff frequency that is larger than a largest frequency of the emission spectrum that exceeds a pre-defined amplitude-related parameter. One end of the waveguide serves as the at least one air intake opening, and the opposite end of the waveguide serves as the at least one air outlet opening.

The phrase "radio frequency waves", as used in this application, shall be understood particularly to encompass a frequency range of electromagnetic waves between 30 kHz and 300 MHz.

Waveguides are designed for conveying electromagnetic waves between their endpoints, provided that a frequency of the electromagnetic wave is larger than the cutoff frequency of the waveguide. An electromagnetic wave whose frequency is lower than the cutoff frequency cannot propagate within the waveguide. Its amplitude is very effectively, namely exponentially, damped in the direction of propagation. That is, the waveguide functions as a highpass filter of which the cutoff frequency applies to the highpass characteristic edge. For example, the attenuation below the cutoff-frequency is set to 3 dB, 30 dB or 100 dB.

In this way, it can be achieved to combine the function of the fan housing of guiding the air taken in by the fan at the air intake opening towards the air outlet opening housing, and the function of containing signals of electromagnetic interference generated by the fan during operation in one member of the air ventilation device, namely the open-ended waveguide, so as not to interfere with EMI-susceptible electronics of the scanner unit. A number of components of the air ventilation device can be reduced and the construction can be simplified, saving weight, space and cost.

In a preferred embodiment, the waveguide has a uniform cross-sectional area in a plane perpendicular to the guiding direction of the waveguide and in at least one continuous portion along the guiding direction of the waveguide. By that, design parameters that meet the requirements regarding a maximum tolerable pressure drop at a desired air flow rate and a minimum desired attenuation of the generated signals of electromagnetic interference can readily be determined.

As electromagnetic waves of a frequency lower than the cutoff frequency of the waveguide are exponentially damped, a sufficient attenuation of the signals of electromagnetic interference generated by the fan during operation can be achieved if a ratio of a length of the waveguide along the direction of propagation and a maximum dimension of the waveguide perpendicular to the direction of propagation is designed to lie in the range between 2 and 10.

In general, the uniform cross-sectional area of the waveguide can have any shape. Preferably, the uniform cross-sectional area is of one out of the shape of a regular polygon, for instance a triangle or a rectangle, of a circular shape or of an elliptical shape. For waveguides with cross-sectional areas of any of these shapes, a cutoff frequency can be readily obtained from theoretical considerations without having to carry out any experiments. Furthermore, waveguides of rectangular or circular cross-section area are widely used and are therefore commercially available for a wide range of frequencies.

For instance, for a waveguide having a rectangular cross-section area, the frequency can readily be determined by the formula $$f_c = \frac{c_0}{2 \cdot a} \qquad (\text{eq. 1})$$

wherein a denotes the larger side of the rectangle and $c_0$ the speed of light in vacuum.

For a rectangular waveguide with a larger side a of 0.3 m, a cutoff frequency of 500 MHz is obtained, and any signal of electromagnetic interference generated by the fan during operation whose frequency is below the cutoff frequency of 500 MHz will be exponentially attenuated along the direction of propagation.

In another preferred embodiment, the waveguide is made from a non-metal material, wherein an inner surface of the waveguide is coated with an electrically conducting coating. As is obvious to the one skilled in the art, due to the skin effect, the electromagnetic field of an electromagnetic wave is able to penetrate into material only to an extent that is characterized by a parameter that is known as the penetration depth. In the regime of the normal skin effect, the penetration depth δ is given by $$\delta = \sqrt{\frac{2}{\sigma \cdot \omega \cdot \mu_0}} \qquad (\text{eq. 2})$$

wherein σ is the electrical conductivity of the material, ω is the angular frequency $2\pi \cdot f$ with f being the frequency of the electromagnetic wave, and $\mu_0$ denotes the magnetic constant of $1.257 \cdot 10^{-6}$ Vs/Am.

For example, for a copper layer ($\sigma = 5.6 \cdot 10^7$ $(\Omega m)^{-1}$) and an electromagnetic wave of a frequency of 300 kHz, the skin depth is about 125 μm. If the copper layer is at least 0.5 mm ($= 4 \cdot \delta$) thick there will be hardly a noticeable difference to a copper bulk material with regard to a penetration of the electromagnetic wave of the specified frequency.

Thus, the thickness of the electrically conducting coating at the inner surface of the waveguide can be designed according to the requirements for attenuating the signals of electromagnetic interference generated by the fan during operation by making use of eq. (2). Preferred materials for the electrically conducting coating are copper and aluminum. By using a non-metal material, for instance a plastic material, for the waveguide, and by coating it with the electrically conducting coating, the weight of the fan housing can substantially be reduced, while at the same time the advantageous properties regarding containing signals of electromagnetic interference generated by the fan during operation can be kept.

In one embodiment, the electrically conducting coating is prepared by applying a conductive paint that adheres to the non-metal material. In one embodiment, the electrically conducting coating comprises a conductive foil that is attached to the non-metal material. In one embodiment, the electrically conducting coating comprises a composite material including a plastic material and electrically conducting metallic or carbon fibers. In principle, the electrically conducting coating may comprise any material that appears suitable to the one skilled in the art.

In another aspect of the invention, an embodiment of any of the air ventilation devices as disclosed herein or a combination thereof is arranged together with the scanner unit of the magnetic resonance imaging system in a radio frequency shielded room, wherein the at least one ventilation duct is connected to the at least one air ventilation inlet port of the scanner unit.

In one embodiment, the waveguide is galvanically coupled to the radio frequency shielded room. In this way, the waveguide has a defined and stable electrical potential, and a shift of the electrical potential of the fan housing due to a capacity coupling with regard to the radio frequency shielded room is prevented. In one embodiment, the radio frequency shifted room is connected to ground.

In another preferred embodiment, the fan housing comprises at least one radio frequency feedthrough for receiving at least one electrical lead that is configured for providing electricity to the fan. Embodiments of radio frequency feedthroughs are common to the one skilled in the art. For instance, the radio frequency feedthrough may comprise a capacitance whose function is to provide a short circuit to an electric ground for high radio frequencies. In this way, a propagation of signals of electromagnetic interference generated by the fan during operation via power leads can be prevented.

In yet another aspect of the invention, a magnetic resonance imaging system is provided that comprises a scanner unit which is configured for acquiring magnetic resonance images from a subject of interest, wherein the magnetic resonance imaging system further includes an embodiment of any of the air ventilation devices disclosed herein or a combination thereof.

BRIEF DESCRIPTION OF THE DRAWING

These and other aspects of the invention will be apparent from and elucidated with reference to the embodiment described hereinafter. Such embodiment does not necessarily represent the full scope of the invention, however, and reference is made therefore to the claims and herein for interpreting the scope of the invention.

In the drawing:

FIG. 1 schematically illustrates an air ventilation device in accordance with the invention arranged together with a scanner unit of a magnetic resonance imaging system in a radio frequency shielded room.

DETAILED DESCRIPTION OF EMBODIMENTS

FIG. 1 is a schematic illustration of an air ventilation device in accordance with the invention. The air ventilation device is adapted for use in a magnetic resonance imaging system and is arranged together with a scanner unit 10 of the magnetic resonance imaging system in a radio frequency shielded room 16 which is provided with an electrical ground connection 18. The scanner unit 10 is one of the widespread bore-type magnetic resonance scanners. An examination space 12 is provided within the bore of the scanner unit magnet to position a subject of interest within for acquiring magnetic resonance images. The scanner unit 10 comprises an air ventilation inlet port 14 for receiving air from the air ventilation device. The air ventilation inlet port 14 is connected to a manifold (not shown) arranged within the scanner unit 10 for distributing the received air, in particular to the examination space 12 and to gradient coils of the scanner unit 10 (not shown).

The air ventilation device includes an electric motor-driven fan 30 that generates signals of electromagnetic interference during operation that form an emission spectrum. A maximum tolerable amplitude-related parameter given by a power spectral density (expressed in $W \cdot Hz^{-1/2}$) of the emission spectrum is predefined that ensures that the signals of electromagnetic interference will not interfere with EMI-susceptible electronics (not shown) of the scanner unit 10. A largest frequency of the emission spectrum at which the predefined maximum tolerable power spectral density is reached or exceeded lies at about 1 MHz.

Further, the air ventilation device comprises a fan housing 34 having an air intake opening 36 and an air outlet opening 38. The fan 30 is arranged inside the fan housing 34 between the air intake opening 36 and the air outlet opening 38, and is configured to, in an active state of operation, take in air through the air intake opening 36 and to convey the air towards the air outlet opening 38. The fan 30 is installed in the fan housing 34 such that the fan 30 cannot be bypassed by air in a direction from the air intake opening 36 to the air outlet opening 38 within the fan housing 34. A flexible ventilation duct 40, for example formed by a bellow-type hose, is provided as a fluid connection that is, in a ready-to-operate state, connected to the air outlet opening 38 with its one end and is connected to the air ventilation inlet port 14 of the scanner unit 10 of the magnetic resonance imaging system with its opposite end.

The fan housing 34 is designed as an open-ended piece of a waveguide 24 for conveying electromagnetic waves. One end of the open-ended waveguide 24 serves as the air intake opening 36, and the opposite end of the open-ended waveguide 24 serves as the air outlet opening 38. In a plane that is arranged perpendicular to a direction of propagation 28 of electromagnetic waves, the waveguide 24 has a uniform cross-sectional area of circular shape along its complete extension in the direction of propagation 28. In FIG. 1, the direction of propagation 28 lies in the drawing plane.

The waveguide 24 is mainly made from a non-metal material, specifically a plastic material, and is therefore lightweight. Its complete inner surface is copper-clad with a copper foil 26 of 2 mm thickness as an electrically conducting coating. The electrically conductive coating is galvanically coupled to the radio frequency shielded room 16 by a copper stud 20 having low inductance so as to reliably provide ground potential to the waveguide 24 also for large radio frequencies.

The fan housing 34 is furnished with two radio frequency feedthroughs $22_1$, $22_2$ for receiving one electric lead $32_1$, $32_2$ each that are configured for providing electricity to the fan 30. The radio frequency feedthroughs $22_1$, $22_2$ at the fan housing 34 are galvanically connected to the copper foil 26. In the same manner, the radio frequency shielded room 16 comprises two radio frequency feedthroughs $22_3$, $22_4$ for receiving the two electric leads $32_1$, $32_2$. The feedthroughs $22_3$, $22_4$ are galvanically connected to the radio frequency shielded room 16.

The circular shape of the uniform cross-sectional area of the waveguide 24 has a diameter d of 200 mm. A ratio of a length of the waveguide 24 along the direction of propagation 28 and the diameter of the waveguide 24 perpendicular to the direction of propagation 28 is designed to lie in the range between 2 and 10, and specifically is about 2.8.

For circular waveguides, a cutoff frequency $f_c$ which is the lowest frequency of any electromagnetic wave that is able to propagate within the waveguide 24, is given by $$f_c = \frac{c_0}{d \cdot \pi} \cdot 1.841$$

which results in a cutoff frequency $f_c$ of the waveguide 24 of about 880 MHz.

The cutoff frequency $f_c$ of the waveguide 24 is therefore much larger than the largest frequency (1 MHz) of the emission spectrum that exceeds the predefined amplitude-related parameter formed by the power spectral density. The signals of electromagnetic interference generated by the fan 30 during operation are therefore exponentially attenuated in the direction of propagation 28 of the waveguide 24 and, when exiting the waveguide 24 are not able to cause any intolerable interference with the EMI-susceptible electronics of the scanner unit 10.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

REFERENCE SYMBOL LIST 10 scanner unit
12 examination space
14 air ventilation inlet port
16 radio frequency shielded room
18 electrical ground connection
20 copper stud
22 feedthrough
24 waveguide
26 copper foil
28 direction of propagation
30 fan
32 electric lead
34 fan housing
36 air intake opening
38 air outlet opening
40 ventilation duct
d waveguide diameter
$f_c$ cutoff frequency

The invention claimed is:

1. An air ventilation device for use in a magnetic resonance imaging system, the air ventilation device comprising:
   an electric motor-driven fan, wherein the fan generates signals of electromagnetic interference during operation that form an emission spectrum,
   a fan housing having at least one air intake opening and at least one air outlet opening, wherein the fan is arranged inside the fan housing between the at least one air intake opening and the at least one air outlet opening, and is configured to, in at least one state of operation, take in air through the at least one air intake opening and to convey the air towards the at least one air outlet opening, at least one ventilation duct provided as a fluid connection that is, in at least one state of operation, connected to the at least one air outlet opening and is connectable to at least one air ventilation inlet port of a scanner unit of the magnetic resonance imaging system, wherein the fan housing is designed as an open-ended waveguide for conveying electromagnetic waves having a cutoff frequency (fc) that is larger than a largest frequency of the emission spectrum that exceeds a predefined amplitude-related parameter, and wherein one end of the waveguide serves as the at least one air intake opening, and the opposite end of the waveguide serves as the at least one air outlet opening.

2. The air ventilation device as claimed in claim 1, wherein the waveguide has a uniform cross-sectional area in a plane perpendicular to a direction of propagation of the waveguide and in at least one continuous portion along the direction of propagation of the waveguide.

3. The air ventilation device as claimed in claim 1, wherein a ratio of a length of the waveguide along the direction of propagation and a maximum dimension (d) of the waveguide perpendicular to the direction of propagation is designed to lie in the range between 2 and 10.

4. The air ventilation device as claimed in claim 1, wherein the uniform cross-sectional area of the waveguide is of one out of a rectangular, circular or elliptical shape.

5. The air ventilation device as claimed in claim 1, wherein the waveguide is made from a non-metal material, wherein an inner surface of the waveguide is coated with an electrically conducting coating.

6. The air ventilation device as claimed in claim 1, wherein the fan housing comprises at least one radio frequency feedthrough for receiving at least one electric lead that is configured for providing electricity to the fan.

7. A magnetic resonance imaging system comprising:

a scanner unit that is configured for acquiring magnetic resonance images from a subject of some interest, and an air ventilation device as claimed in claim 1.

8. A magnetic resonance imaging system with a scanner unit in a radio frequency shielded room, comprising an air ventilation device as claimed in claim 1, wherein the air ventilation device is arranged with the scanner unit with the at least one ventilation duct connected to the at least one air ventilation inlet port of the scanner unit.

9. The magnetic resonance imaging system comprising the air ventilation device as claimed in claim 8, wherein the waveguide is galvanically coupled to the radio frequency shielded room.

* * * * *